United States Patent
Voo

(10) Patent No.: US 7,696,820 B1
(45) Date of Patent: Apr. 13, 2010

(54) INCREASING AMPLIFIER BANDWIDTH BY POSITIVE CAPACITIVE FEEDBACK

(75) Inventor: Thart Fah Voo, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/231,829

(22) Filed: Sep. 5, 2008

Related U.S. Application Data

(63) Continuation of application No. 11/326,039, filed on Jan. 5, 2006, now Pat. No. 7,423,483.

(60) Provisional application No. 60/692,072, filed on Jun. 20, 2005.

(51) Int. Cl.
*H03F 1/36* (2006.01)

(52) U.S. Cl. .......................... 330/109; 330/99; 330/100

(58) Field of Classification Search ........... 330/98–100, 330/109, 150, 310
See application file for complete search history.

(56) References Cited

U.S. PATENT DOCUMENTS

| 4,591,805 | A | 5/1986 | Highton ...................... 330/294 |
| 4,801,893 | A | 1/1989 | Perandi ...................... 330/300 |
| 5,017,884 | A | 5/1991 | Perandi .......................... 330/3 |
| 5,745,002 | A | 4/1998 | Baschirotto et al. .......... 327/554 |
| 6,281,747 | B2 | 8/2001 | Ahuja et al. ................. 330/109 |
| 6,573,791 | B2 * | 6/2003 | Sridhar ........................ 330/109 |
| 6,621,334 | B2 | 9/2003 | Ausserlechner et al. ........ 330/9 |
| 6,784,734 | B2 | 8/2004 | Amourah |
| 6,822,512 | B2 | 11/2004 | Brokaw |
| 7,116,164 | B1 | 10/2006 | Aram .......................... 330/99 |
| 7,276,965 | B1 * | 10/2007 | Sutardja ....................... 330/99 |
| 7,423,483 | B1 | 9/2008 | Voo |
| 7,495,422 | B2 * | 2/2009 | Mok et al. ................... 323/280 |
| 2003/0052732 | A1 | 3/2003 | Shapiro |
| 2004/0196936 | A1 | 10/2004 | Kawama et al. ............. 375/350 |

OTHER PUBLICATIONS

USPTO Non-Final Office Action mailed Jun. 29, 2007 for U.S. Appl. No. 11/326,039, filed Jan. 5, 2006.
Amendment filed Sep. 28, 2007 in response to USPTO Non-Final Office Action mailed Jun. 29, 2007 for U.S. Appl. No. 11/326,039, filed Jan. 5, 2006.
USPTO Non-Final Office Action mailed Dec. 31, 2007 for U.S. Appl. No. 11/326,039, filed Jan. 5, 2006.
Amendment filed Mar. 26, 2008 in response to USPTO Non-Final Office Action mailed Dec. 31, 2007 for U.S. Appl. No. 11/326,039, filed Jan. 5, 2006.
Schin'ichiro Azuma et al., Embedded Anti-Aliasing in Switched-Capacitor Ladder Filters With Variable Gain and Offset Compensation, IEEE Journal of Solid-State Circuits, vol. 37, No. 3 Mar. 2002, pp. 349-356.

* cited by examiner

*Primary Examiner*—Khanh V Nguyen

(57) ABSTRACT

An amplifier circuit includes first, second, and third amplifiers each having an input and an output. The amplifier circuit further includes first and second capacitances and a resistance. The input of the second amplifier communicates with the output of the first amplifier. The first capacitance communicates with the input of the first amplifier and the output of the second amplifier. The input of the third amplifier communicates with the output of the second amplifier. The second capacitance communicates with the output of the third amplifier and the input of the second amplifier. The resistance directly communicates with the output of the third amplifier and the input of the first amplifier.

4 Claims, 8 Drawing Sheets

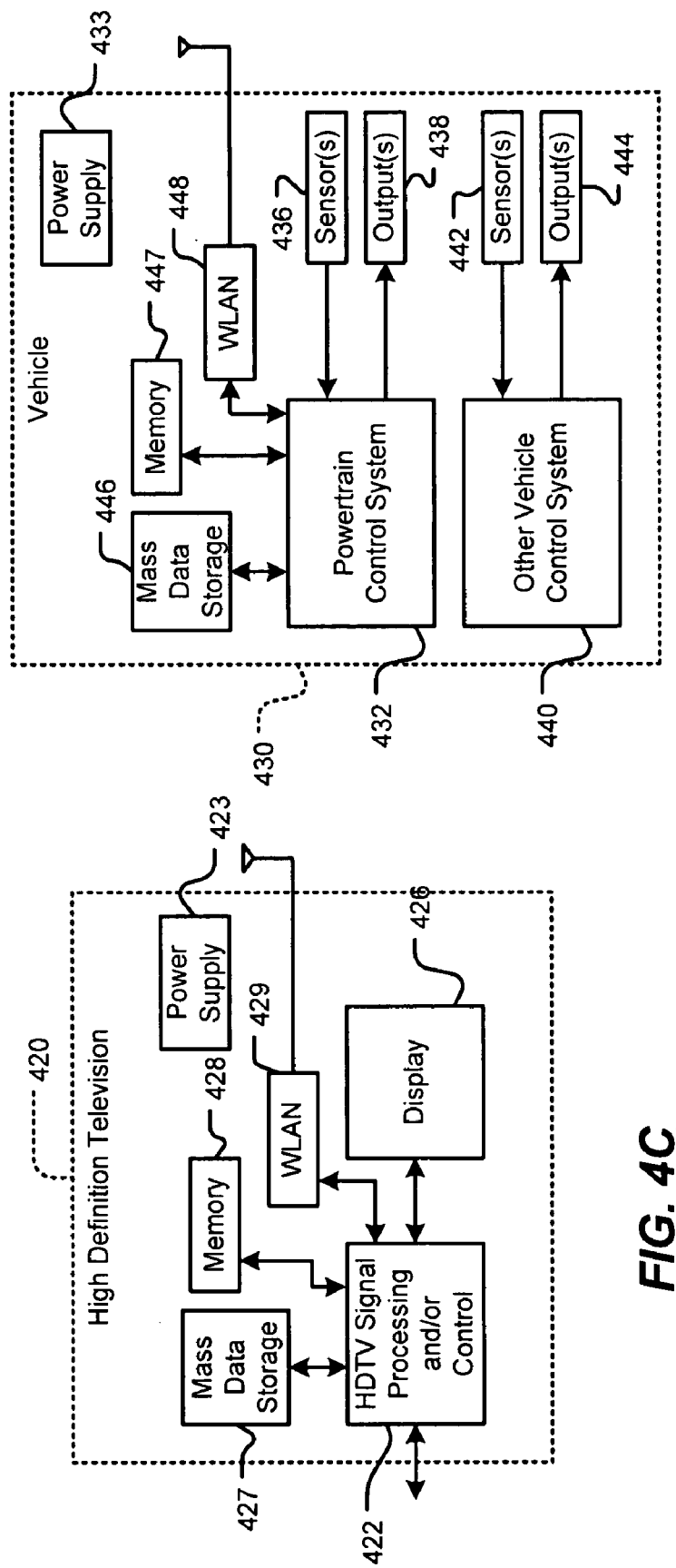

INCREASING AMPLIFIER BANDWIDTH BY POSITIVE CAPACITIVE FEEDBACK

CROSS-REFERENCE TO RELATED APPLICATIONS

This application is a continuation of U.S. patent application Ser. No. 11/326,039, filed Jan. 5, 2006, which claims the benefit of U.S. Provisional Application No. 60/692,072, filed Jun. 20, 2005. The disclosures of the above applications are incorporated herein by reference in their entirety.

FIELD OF THE INVENTION

The present invention relates to amplifiers, and more particularly to increasing bandwidth of amplifiers.

BACKGROUND OF THE INVENTION

Operational amplifiers (Op-amps) are often used in signal processing applications such as filter circuits, amplifier circuits etc. Referring now to FIGS. 1A-1C, an op-amp 10 has an inverting input 12, a non-inverting input 14, and an output 16. Op-amps may be used as inverters. In FIG. 1B, an electrical schematic of an op-amp 20 in a typical inverter configuration is shown. In an inverter, an input signal is applied to the inverting input of the op-amp. A phase of the output of the inverter is 180 degrees out of phase with respect to the input to the inverter. Resistors $R_1$ and $R_2$ determine a gain of the inverter 20. For example, an inverter is called a unity gain amplifier when $R_1=R_2$. In FIG. 1C, a symbol 24 used to represent an inverter in a circuit diagram is shown.

Referring now to FIG. 1D, a frequency response of an amplifier shows a graph of the gain of the amplifier as a function of the frequency of the input signal. A range of input signal frequencies that an amplifier can amplify at or above a predetermined gain is called the bandwidth of the amplifier. The gain bandwidth product of an op-amp is typically constant. Thus, the bandwidth of an op-amp is inversely proportional to the gain of the op-amp.

SUMMARY OF THE INVENTION

An amplifier circuit comprises a first amplifier having an input and an output, and a second amplifier having an input that communicates with the output of the first amplifier, and an output. The amplifier circuit further comprises a first capacitance that communicates with the input of the first amplifier and the output of the second amplifier. The amplifier circuit further comprises a third amplifier having an input that communicates with the output of the second amplifier, and an output. The amplifier circuit further comprises a second capacitance that communicates with the output of the third amplifier and the input of the second amplifier.

In another feature, the amplifier circuit further comprises a resistance that communicates with the output of the third amplifier and the input of the first amplifier.

In another feature, a multistage amplifier circuit comprises N cascaded stages of the amplifier circuit, where N is an integer greater than 1.

In another feature, a multistage amplifier circuit comprises N cascaded stages of the amplifier circuit that includes the resistance, where N is an integer greater than 1.

In another feature, a differential amplifier circuit comprises a first amplifier circuit and a second amplifier circuit, wherein the input of the first amplifier of the first amplifier circuit is out of phase with respect to the input of the first amplifier of the second amplifier circuit. In still other features, a multi-stage differential amplifier circuit comprises M cascaded stages of the differential amplifier circuit, wherein M is an integer greater than 1.

In another feature, a differential amplifier circuit comprises a first amplifier circuit that includes the resistance and a second amplifier circuit that includes the resistance, wherein the input of the first amplifier of the first amplifier circuit is out of phase with respect to the input of the first amplifier of the second amplifier circuit. In still other features, a multi-stage differential amplifier circuit comprises M cascaded stages of the differential amplifier circuit that includes the resistance, wherein M is an integer greater than 1.

In another feature, at least one of the first amplifier, the second amplifier, and the third amplifier is an inverting amplifier. Is still other features, at least one of the first amplifier, the second amplifier, and the third amplifier is a transimpedance amplifier.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4C is a functional block diagram of a high definition television;

FIG. 4D is a functional block diagram of a vehicle control system;

DETAILED DESCRIPTION OF THE PREFERRED EMBODIMENTS

Figure 1A:
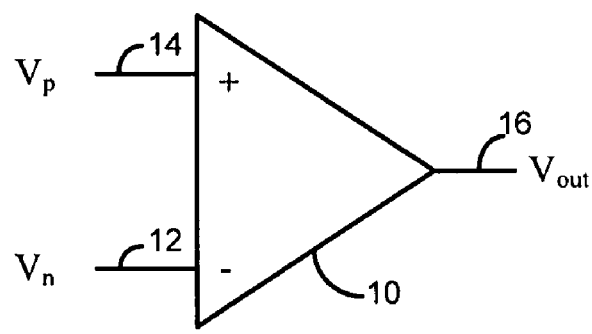
FIG. 1A shows an operational amplifier (op-amp) according to the prior art.
Figure 1B:
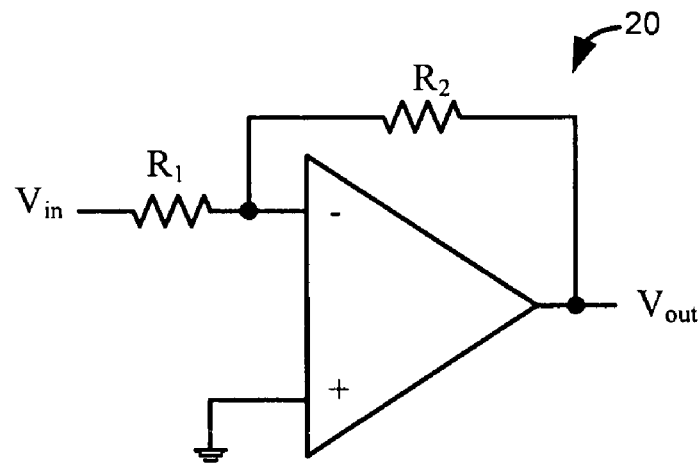
FIG. 1B shows an electrical schematic of an op-amp in an inverter configuration according to the prior art.
Figure 1C:
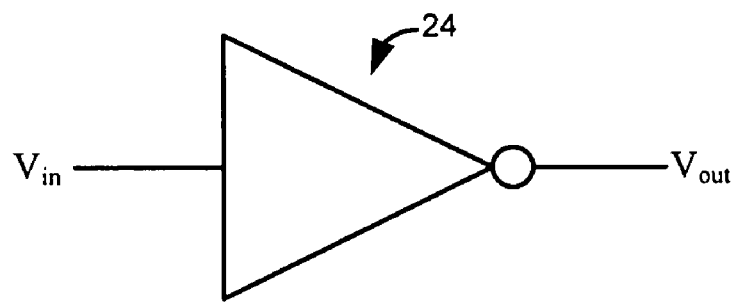
FIG. 1C shows a symbol for an inverter according to the prior art.
Figure 1D:
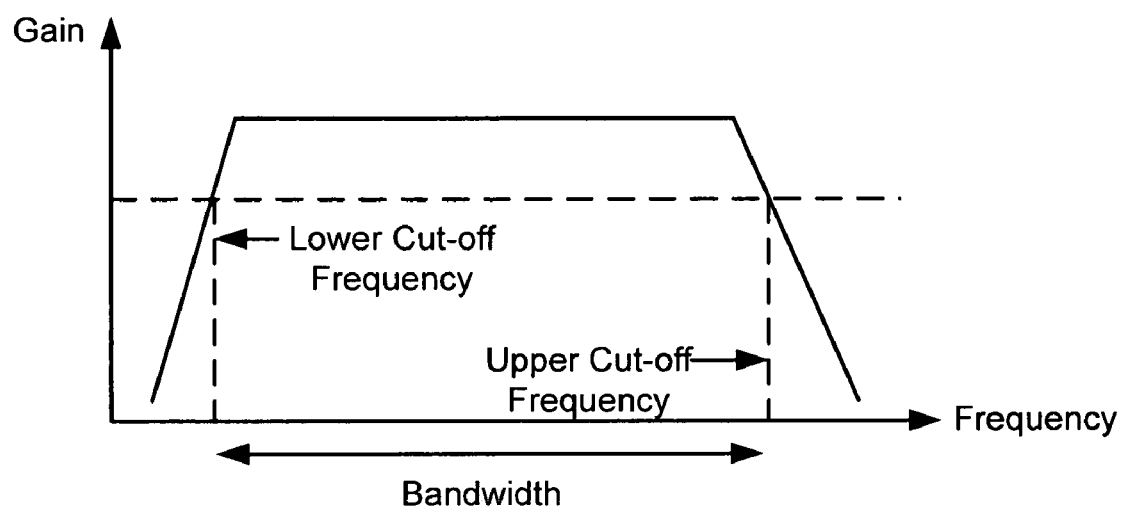
FIG. 1D shows a graph of gain of an op-amp as a function of input frequency according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Bandwidth of an amplifier may be increased by lowering the lower cut-off frequency and/or increasing the upper cut-off frequency. Increasing the input impedance of an amplifier, feeding back the output of an amplifier to the input of the amplifier, and other techniques may be used to improve the frequency response and bandwidth of an amplifier. For example, increasing the input impedance of an amplifier lowers the low frequency cut-off of the amplifier and thus improves the frequency response of the amplifier at low frequencies.

Different feedback configurations are used in circuits that utilize op-amps. Generally, the feedback configurations may be classified into two categories: negative feedback and positive feedback. In a negative feedback configuration, the output of an op-amp is fed back to the inverting input of the op-amp. In a positive feedback configuration, a part of the output of an op-amp is fed back to the non-inverting input of the op-amp. Negative feedback tends to stabilize an amplifier while positive feedback tends to saturate an amplifier. The feedback circuit may comprise a resistor, a capacitor, or another amplifier. When an amplifier is used in a feedback circuit, the feedback circuit is called a nested feedback stage.

Amplifiers may be cascaded or connected in series to increase the gain and/or bandwidth of a cascaded amplifier. In a cascade configuration, each cascaded amplifier circuit is called a stage, and an output of one stage is fed to an input of a next stage.

Figure 2A:
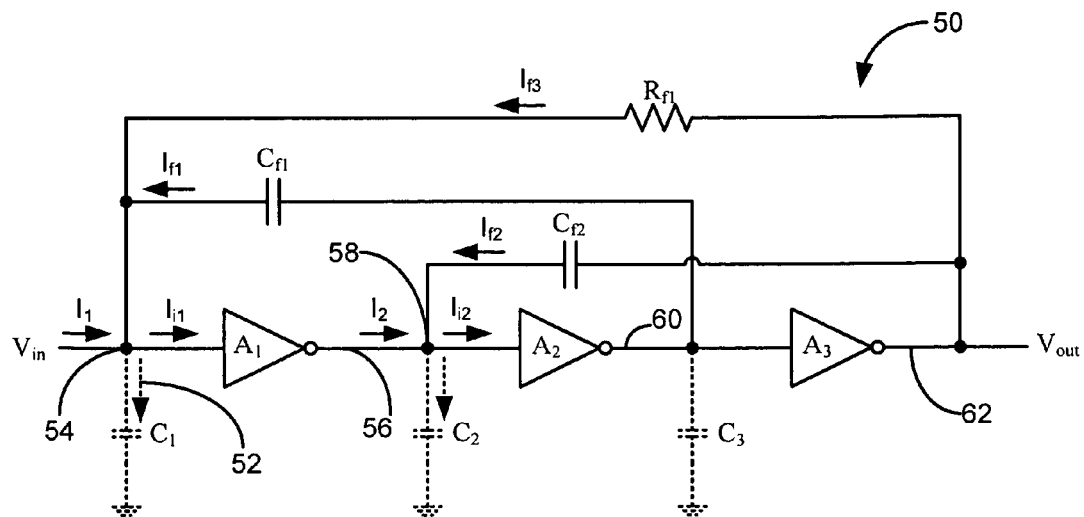
FIG. 2A shows an electrical schematic of a single-ended cascaded amplifier with feedback according to the present invention.
Figure 2B:
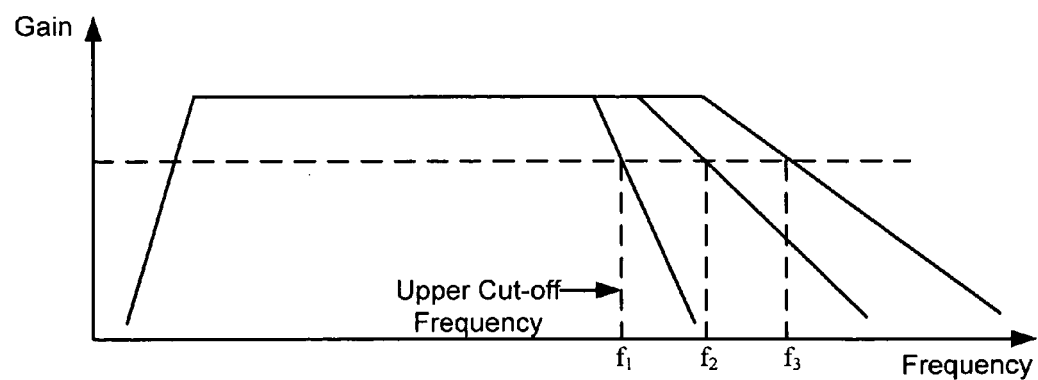
FIG. 2B shows a graph of gain of the cascaded amplifier with feedback as a function of input frequency according to the present invention.

Referring now to FIGS. 2A and 2B, a system 50 for increasing bandwidth of an amplifier is shown. Amplifiers $A_1$, $A_2$, and $A_3$ are connected in a single-ended cascaded amplifier configuration. Amplifiers $A_1$, $A_2$, and $A_3$ are inverting amplifiers. That is, an output of the amplifier $A_1$ is out of phase with respect to an input of the amplifier $A_1$, and so on. Alternatively, amplifiers $A_1$, $A_2$, and $A_3$ may be transimpedance amplifiers. Capacitors $C_1$, $C_2$, and $C_3$ represent the input capacitances or the parasitic capacitances of the amplifiers $A_1$, $A_2$, and $A_3$ respectively. $V_{in}$ represents an input signal. The frequency of the input signal $V_{in}$ is called input frequency and may vary.

The capacitor $C_{f1}$ is a feedback capacitor that feeds back an output 60 of the amplifier $A_2$ to an input 54 of the amplifier $A_1$. The capacitor $C_{f2}$ is a feedback capacitor that feeds back an output 62 of the amplifier $A_3$ to an input 58 of the amplifier $A_2$. The resistor $R_{f1}$ is a feedback resistor that feeds back the output 62 of the amplifier $A_3$ to the input 54 of the amplifier $A_1$. The feedback capacitors $C_{f1}$ and $C_{f2}$ provide positive feedback, and the feedback resistor $R_{f1}$ provides negative feedback. FIG. 2B shows a frequency response that is a graph of gain of the single ended cascaded amplifier as a function of the input frequency.

The input signal $V_{in}$ supplies a current $I_1$ to the input 54 of the amplifier $A_1$. The feedback capacitor $C_{f1}$ supplies a current $I_{f1}$ to the input 54 of the amplifier $A_1$. Thus, an input current $I_{i1}$ that is supplied to the input 54 of the amplifier $A_1$ is a sum of the currents $I_1$ and $I_{f1}$. Thus, $I_{i1}=I_1+I_{f1}$.

If the feedback capacitor $C_{f1}$ is absent, the feedback current $I_{f1}$ is zero, and the input current $I_{i1}$ is the same as the current $I_1$. As the input frequency of the input signal $V_{in}$ increases, the impedance of the capacitor $C_1$, $1/jwC_1$, decreases. Consequently, more AC current flows to ground through the capacitor C, as shown by a dotted arrow 52 in FIG. 2A. As the input frequency of the input signal $V_{in}$ exceeds a frequency $f_1$, the effective current $I_{i1}$ decreases. This capacitive loading due to the capacitor C1 causes the output 56 of the amplifier $A_1$ to decrease at input frequencies greater than $f_1$.

Thus, the input signals of frequencies greater than $f_1$ are not amplified at the designed gain of the amplifier resulting in a drop in the bandwidth of the amplifier as shown in FIG. 2B. The frequency $f_1$ is called an upper cut-off frequency of the amplifier A1. Generally, the capacitive loading due to the capacitor $C_1$ is more than the capacitive loading due to the capacitors $C_2$ and $C_3$ because the capacitor $C_1$ is directly coupled to the source of input signal $V_{in}$.

When the feedback capacitor $C_{f1}$ is present, the decrease in the effective current $I_{i1}$ at frequencies greater than $f_1$ is compensated by the feedback current $I_{f1}$ supplied by the feedback capacitor $C_{f1}$. Thus, at input frequencies greater than $f_1$, the current $I_{i1}$ does not decrease. Consequently, the output of the amplifier $A_1$ does not decrease at and above the frequency $f_1$. Thus, the input signals of frequency f, and above are amplified at the designed gain of the amplifier.

The output 56 of the amplifier $A_1$ now begins to decrease at a frequency $f_2$ instead of $f_1$, where $f_2$ is greater than $f_1$, as shown in FIG. 2B. Thus, effectively, the upper cut-off frequency of the cascaded amplifier is increased from $f_1$ to $f_2$ by adding the feedback capacitor $C_{f1}$. The value of $C_{f1}$ determines the magnitude of increase in the upper cut-off frequency, $(f_2-f_1)$.

The output 60 of the amplifier $A_2$ is in phase with the input 54 of the amplifier $A_1$. Since the capacitor $C_{f1}$ feeds back the current $I_{f1}$ from the output 60 of the amplifier $A_2$ to the input 54 of the amplifier $A_1$, the current $I_{f1}$ is in phase with the currents $I_1$ and $I_{i1}$ that are input to the amplifier $A_1$. Therefore, the feedback provided by the feedback capacitor $C_{f1}$ constitutes a positive feedback.

Similarly, the feedback capacitor $C_{f2}$ provides a positive feedback from the output 62 of the amplifier $A_3$ to the input 58 of the amplifier $A_2$. This feedback further increases the upper cut-off frequency of the cascaded amplifier from $f_2$ to $f_3$ as shown in FIG. 2B. The value of $C_{f2}$ determines the magnitude of increase in the upper cut-off frequency, $(f_3-f_2)$. Generally, adding the feedback capacitor $C_{f1}$ may increase the load of the amplifier $A_2$ and may decrease the bandwidth of the amplifier $A_2$. Adding the feedback capacitor $C_{f2}$, however, helps in boosting the upper cut-off frequency and the bandwidth of the amplifier A2.

As can be appreciated, by cascading more inverting amplifiers in increments of two and by adding feedback capacitors between the outputs and inputs of every two successive amplifiers, the upper cut-off frequency of the cascaded amplifier can be increased. Consequently, the high-frequency response and the bandwidth of the cascaded amplifier can be increased.

The positive feedback provided by the capacitors $C_{f1}$ and $C_{f2}$, however, increases the gain of the cascaded amplifier. This can make the cascaded amplifier unstable. The instability may compound as more pairs of amplifiers and feedback capacitors are cascaded. A negative feedback can help maintain the gain of the cascaded amplifier relatively constant.

The phase of the output 62 of the amplifier $A_3$ is 180 degrees opposite of the phase of the input 54 of the amplifier $A_1$. A feedback resistor $R_{f1}$ is added between the output 62 of the amplifier $A_3$ and the input 54 of the amplifier $A_1$ to provide a negative feedback. The feedback resistor $R_{f1}$ feeds back a current $I_{f3}$ from the output 62 of the amplifier $A_3$ to the input 54 of the amplifier $A_1$. The input current $I_{i1}$ is now a sum of the currents $I_1$, $I_{f1}$, and $I_{f3}$. Thus, $I_{i1}=I_1+I_{f1}+I_{f3}$.

Since the current $I_{f3}$ is 180 degrees out of phase compared to the phase of the currents $I_1$ and $I_{f1}$, the current $I_{f3}$ reduces the increase in gain resulting due to the current $I_{f1}$. This stabilizes the cascaded amplifier. The magnitude of the reduction in the gain of the amplifier due to the current $I_{f3}$ depends on the value of the resistor $R_{f1}$. Thus, by cascading inverting amplifiers in increments of three and by using a combination of positive and negative feedback, the bandwidth of the cascaded amplifier can be increased while maintaining gain relatively constant.

Figure 3:
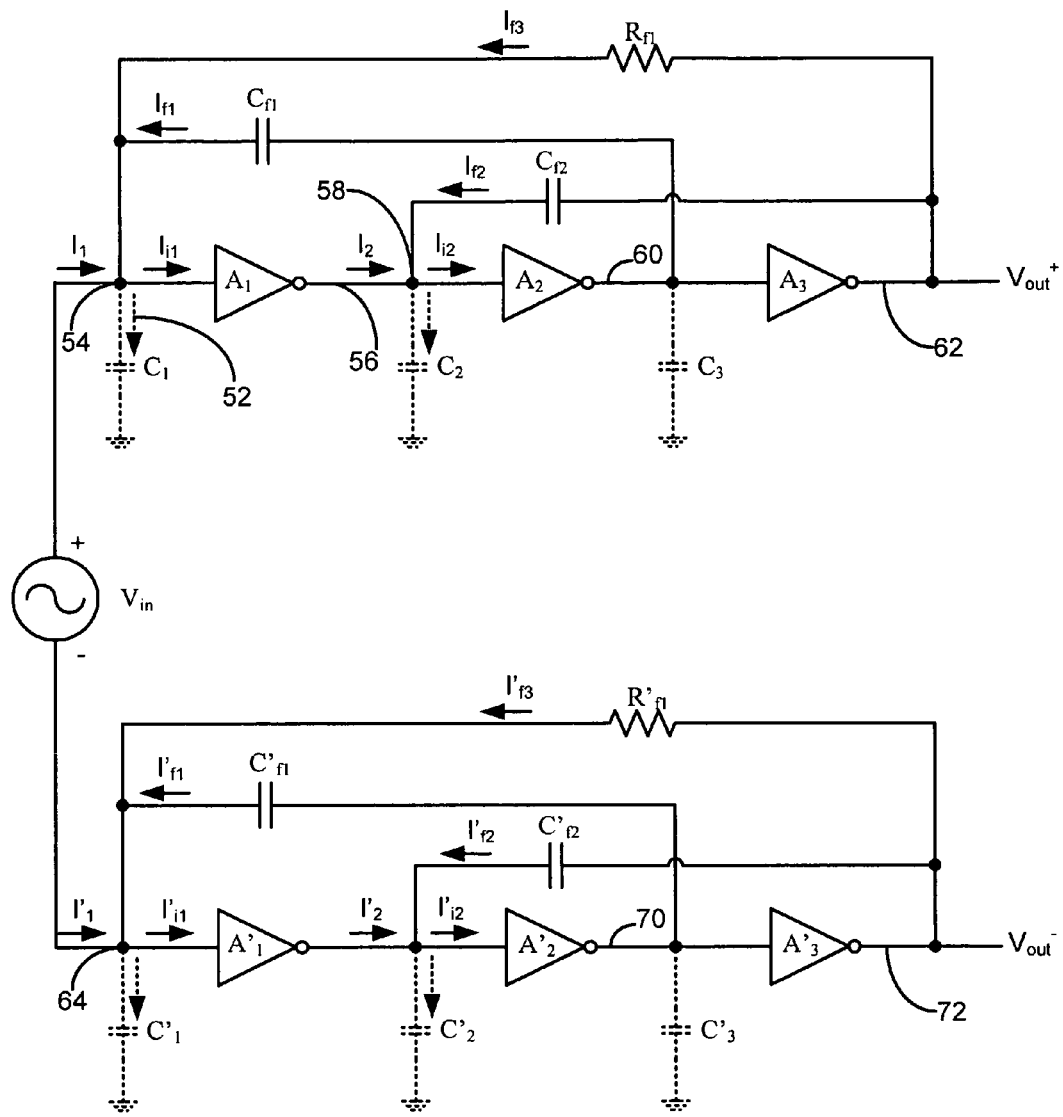
FIG. 3 shows an electrical schematic of a differential cascaded amplifier with feedback according to the present invention.

Referring now to FIG. 3, a differential configuration of a cascaded amplifier is shown. The differential configuration uses positive and negative feedback similar to the single-ended configuration shown in FIG. 2A. In the differential configuration, however, the inputs 54 and 64 are not in phase. Consequently, the outputs 62 and 72 are not in phase. The bandwidth of the differential amplifier is increased essentially in the same manner as in the single-ended configuration.

Alternatively, positive feedback can be obtained by cross-coupling positive and negative paths. For example, the feedback capacitor $C_{f1}$ in the positive feedback path can be connected to node 72 instead of node 60, and the feedback capacitor $C_{f2}$ can be connected to node 70 instead of node 62. Multiple stages of the differential configuration may be cascaded.

Figure 4B:
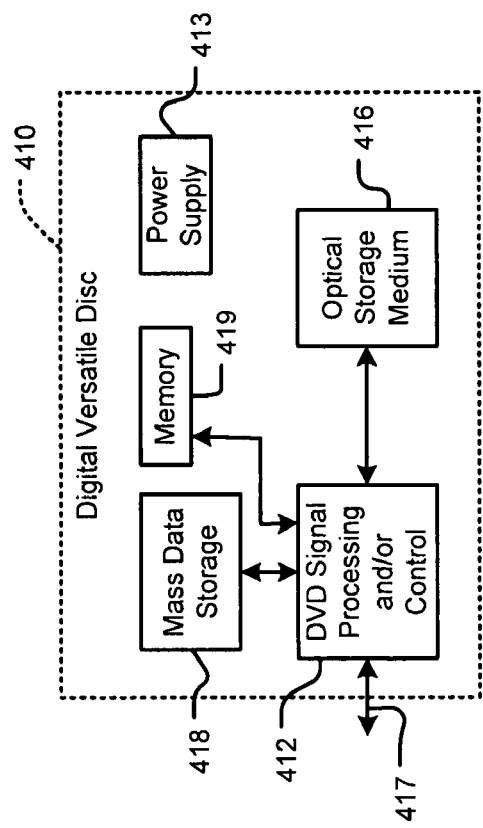
FIG. 4B is a functional block diagram of a digital versatile disk (DVD)
Figure 4A:
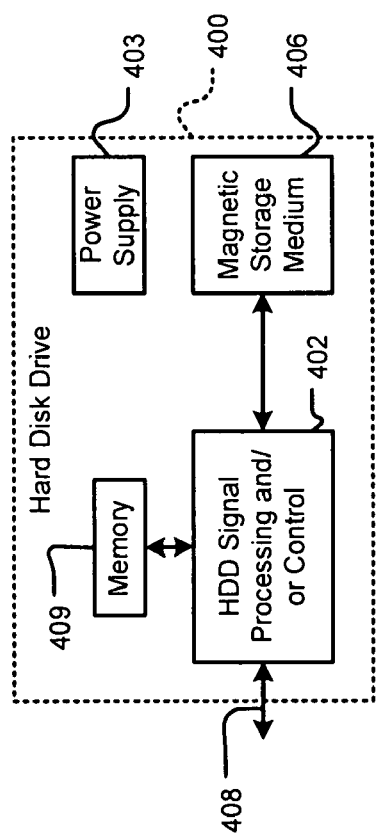
FIG. 4A is a functional block diagram of a hard disk drive.

Referring now to FIGS. 4A-4G, various exemplary implementations of the present invention are shown. Referring now to FIG. 4A, the present invention can be implemented in a hard disk drive 400. The present invention may be implemented in either or both signal processing and/or control circuits and/or a power supply 403, which are generally identified in FIG. 4A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 4B, the present invention can be implemented in a digital versatile disc (DVD) drive 410. The present invention may be implemented in either or both signal processing and/or control circuits, which are generally identified in FIG. 4B at 412, mass data storage of the DVD drive 410 and/or a power supply 413. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 4A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Referring now to FIG. 4C, the present invention can be implemented in a high definition television (HDTV) 420. The present invention may be implemented in either or both signal processing and/or control circuits, which are generally identified in FIG. 4C at 422, a WLAN interface, mass data storage of the HDTV 420 and/or a power supply 423. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 4A and/or at least one DVD may have the configuration shown in FIG. 4B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 4D, the present invention may be implemented in a control system of a vehicle 430, a WLAN interface, mass data storage of the vehicle control system and/or a power supply 433. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 4E:
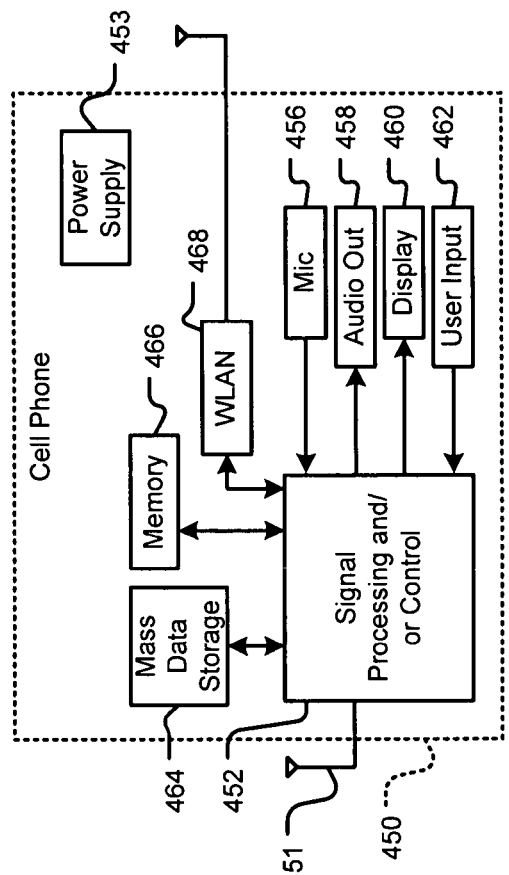
FIG. 4E is a functional block diagram of a cellular phone.

Referring now to FIG. 4E, the present invention can be implemented in a cellular phone 450 that may include a cellular antenna 451.

The present invention may be implemented in either or both signal processing and/or control circuits, which are generally identified in FIG. 4E at 452, a WLAN interface, mass data storage of the cellular phone 450 and/or a power supply 453. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 4F:
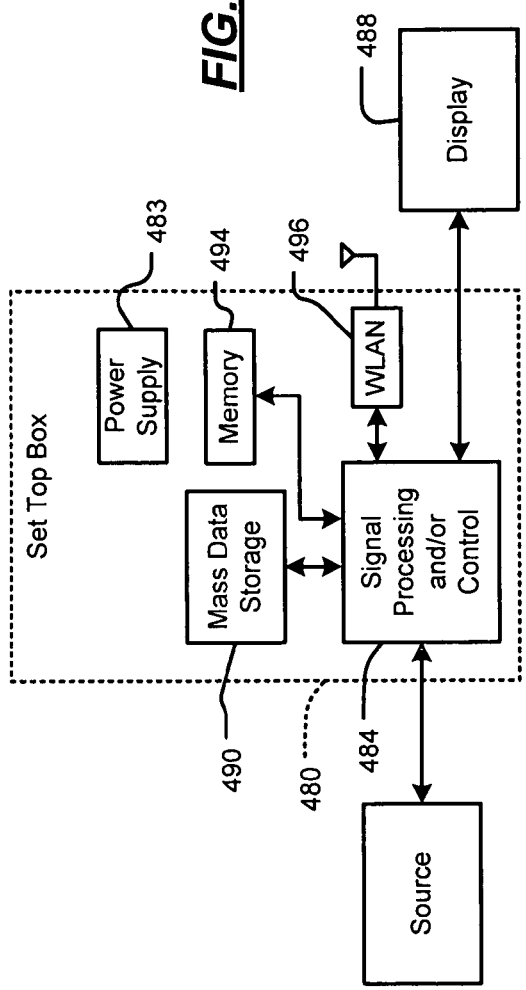
FIG. 4F is a functional block diagram of a set top box.

Referring now to FIG. 4F, the present invention can be implemented in a set top box 480. The present invention may be implemented in either or both signal processing and/or control circuits, which are generally identified in FIG. 4F at 484, a WLAN interface, mass data storage of the set top box 480 and/or a power supply 483. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 4G:
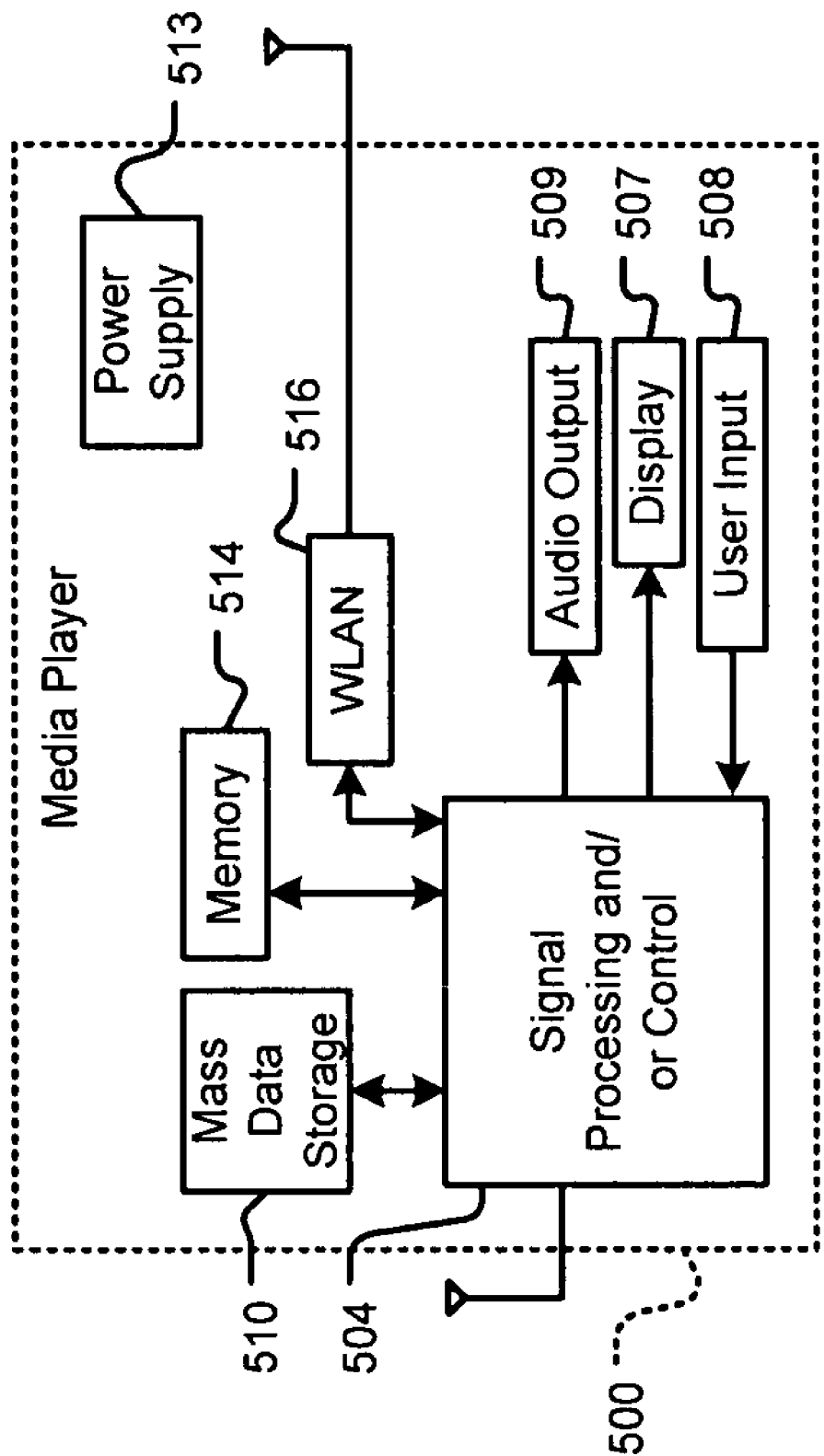
FIG. 4G is a functional block diagram of a media player.

Referring now to FIG. 4G, the present invention can be implemented in a media player 500. The present invention may be implemented in either or both signal processing and/or or control circuits, which are generally identified in FIG. 4G at 504, a WLAN interface, mass data storage of the media player 500 and/or a power supply 503. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An amplifier circuit, comprising:
    a first amplifier having an input and an output;
    a second amplifier having an input that communicates with said output of said first amplifier, and an output;
    a first capacitance that communicates with said input of said first amplifier and said output of said second amplifier;
    a third amplifier having an input that communicates with said output of said second amplifier, and an output;
    a second capacitance that communicates with said output of said third amplifier and said input of said second amplifier; and
    a resistance that directly communicates with said output of said third amplifier and said input of said first amplifier.
2. A multistage amplifier circuit comprising N cascaded stages of amplifier circuit of claim 1, where N is an integer greater than 1.
3. An amplifier circuit comprising:
    a first amplifier means having an input and an output;
    a second amplifier means having an input and an output, wherein the input of the second amplifier means communicates with the output of the first amplifier means;

a first capacitance means that communicates with the input of the first amplifier means and the output of the second amplifier means;

a third amplifier means having an input and an output, wherein the input of the third amplifier means communicates with the output of the second amplifier means;

a second capacitance means that communicates with the output of the third amplifier means and the input of the second amplifier means; and resistance means that directly communicates with the output of the third amplifier means and the input of the first amplifier means.

4. A multistage amplifier circuit comprising N cascaded stages of the amplifier circuit of claim 3, where N is an integer greater than 1.

* * * * *